United States Patent [19]

Herbst

[11] 4,167,425

[45] Sep. 11, 1979

[54] METHOD FOR PRODUCING LATERAL BIPOLAR TRANSISTOR BY ION-IMPLANTATION AND CONTROLLED TEMPERATURE TREATMENT

[75] Inventor: Heiner Herbst, Haar, Fed. Rep. of Germany

[73] Assignee: Siemens Aktiengesellschaft, Berlin & Munich, Fed. Rep. of Germany

[21] Appl. No.: 899,264

[22] Filed: Apr. 24, 1978

Related U.S. Application Data

[62] Division of Ser. No. 724,621, Sep. 20, 1976, abandoned.

[30] Foreign Application Priority Data

Sep. 19, 1975 [DE] Fed. Rep. of Germany ....... 2541907

[51] Int. Cl.$^2$ .................. H01L 21/265; H01L 21/26; H01L 29/72
[52] U.S. Cl. ..................................... 148/1.5; 148/187; 357/34; 357/35; 357/91
[58] Field of Search ................... 148/1.5, 187; 357/34, 357/35, 91

[56] References Cited

U.S. PATENT DOCUMENTS

| | | | |
|---|---|---|---|
| 3,933,528 | 1/1976 | Sloan, Jr. | 148/1.5 |
| 3,967,307 | 6/1976 | Muller et al. | 357/35 |
| 4,045,251 | 8/1977 | Graul et al. | 148/1.5 |

FOREIGN PATENT DOCUMENTS

| | | | |
|---|---|---|---|
| 906667 | 8/1972 | Canada | 357/35 |
| 46-36821 | 10/1971 | Japan | 357/35 |

OTHER PUBLICATIONS

Zeidenbergs, "Lateral PNP Transistor - -" IBM-TDB, 14, (1972), 3248.
Cowan et al., "Compatible----PND----Device," IBM-TDB, 13, (1970), 939.

Primary Examiner—L. Dewayne Rutledge
Assistant Examiner—Upendra Roy
Attorney, Agent, or Firm—Hill, Van Santen, Steadman, Chiara & Simpson

[57] ABSTRACT

A lateral bipolar transistor has a semiconductor substrate of first conductivity type with an epitaxial layer arranged thereon of second conductivity type. Collector and emitter zones of first conductivity type are laterally arranged in the epitaxial layer. A base terminal contact zone connects with the epitaxial layer and a buried layer of second conductivity type is placed in the epitaxial layer below the emitter and collector zones. The buried layer has a doping concentration higher than the epitaxial layer so that a minority carrier current emanating from the emitter zone in a vertical direction is minimized. A doping profile of the emitter zone and portions of the base adjacent thereto is provided such that an additional potential barrier is created adjacent to and directly beneath the emitter zone in order to further minimize minority charge carriers emanating at a vertical direction from the emitter zone. The doping profile does not create any additional potential barrier in a lateral direction with respect to the emitter zone and the emanation of minority carriers from the emitter zone in a lateral direction is substantially uneffected.

7 Claims, 4 Drawing Figures

METHOD FOR PRODUCING LATERAL BIPOLAR TRANSISTOR BY ION-IMPLANTATION AND CONTROLLED TEMPERATURE TREATMENT

This is a division of application Ser. No. 724,621, filed Sept. 20, 1976, now abandoned.

BACKGROUND OF THE INVENTION

1. Field of the Invention

The invention relates to a lateral, bipolar transistor.

2. Description of the Prior Art

Bipolar integrated circuits employ not only npn transistors of vertical construction, but also lateral, bipolar pnp transistors. For many applications, however, lateral pnp transistors exhibit too low a current amplification. This partly results since with a usual geometric arrangement the emitter injects charge carriers not only in the lateral direction towards the collector but also in the vertical direction. An undesired injection of this type leads to a higher base current and consequently to a lower current amplification.

It is known to reduce the vertical injection of charge carriers by the use of a buried layer with its associated electric field. In the publication "Schottky diodes makes IC scene," Electronics July 21, 1969, p. 74–80, on page 79 a lateral pnp transistor of this type with a buried layer is illustrated. However, even with these transistors, the problem of the injection of charge carriers in the vertical direction remains.

SUMMARY OF THE INVENTION

It is an object of the invention to provide a lateral, bipolar transistor in which there is no injection of charge carriers in a vertical direction from the emitter.

This object is realized by a lateral, bipolar transistor in which a doping profile within and through the emitter zone creates a potential barrier for minority charge carriers emanating from the emitter zone in a vertical direction, yet has no effect upon and does not create an additional potential barrier for minority charge carriers emanating from the emitter zone in a lateral direction. The potential barrier is created by an ion implanation and temperature treatment of donor ions introduced into the emitter zone such that a region of conductivity type which is the same as the base region but of higher concentration is created directly beneath the emitter zone. By preventing the donor ions from diffusing laterally outside of the emitter zone, an additional potential barrier is not created for minority carriers emanating laterally from the emitter zone.

It is a fundamental advantage of the transistors of this invention in that they exhibit a higher current amplification than corresponding transistors of the prior art.

Preferably the diffusion and ion implantation steps necessary for the production of a transistor in accordance with the invention are carried out through the same masking window.

DESCRIPTION OF THE PREFERRED EMBODIMENTS

Figure 1:
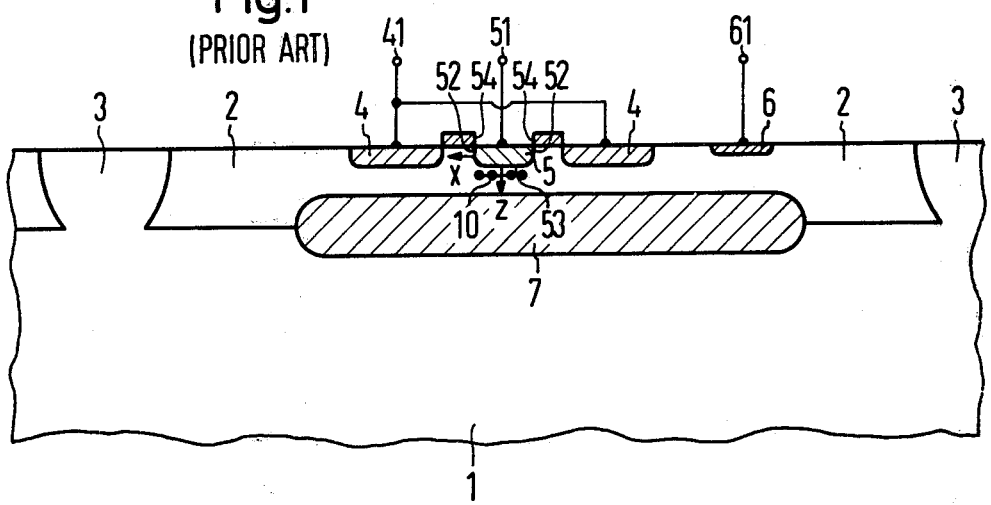
FIG. 1 is a side cross-sectional view of a lateral pnp transistor of the prior art.

In the following, the construction of a lateral bipolar pnp transistor known in the prior art will first be described with reference to FIG. 1. On the p-substrate 1, which is preferably a substrate consisting of silicon, an n-conducting epitaxy layer 2 is applied in which isolation diffusions 3 are arranged in order to electrically insulate individual transistors from one another. Preferably these separating diffusions are p+ doped within the n-conducting epitaxy later 2. Arranged in the epitaxy layer 2 are the preferably p+ doped collector zone 4 with the terminal 41, the preferably p+ doped emitter zone 5 with the terminal 51, and the preferably n+ doped base contact 6 with the terminal 61. As shown in the Figure, for example, the collector zone 4 is arranged in the shape of a ring around the emitter zone 5. The preferably n+ doped buried layer 7 is arranged beneath the zones 4, 5 and 6, between the epitaxy layer 2 and the substrate 1. The function of this layer is to reduce an injection of charge carriers emanating from the emitter zone 5 in the vertical direction into the substrate 1.

The following observation led to the invention. When voltages are connected, a specific hole concentration occurs at the edge of the emitter-base junction, that is the junction between the zone 5 and the epitaxy layer 2. The current flow basically occurs by diffusion in accordance with the concentration gradient in the epitaxy layer. Normally this gradient is greatest in the actual base zone between the emitter zone 5 and the collector zone 4, and therefore in the lateral direction. In the vertical direction, the gradient is determined by the recombination in the epitaxy later 2 and in the buried layer 7, and by the electric field which has formed as a result of the buried layer. The vertical overall current also becomes significant since the injecting area 53 of the zone 5 is considerably larger than the area 52 which governs the lateral injection from the zone 5. In accordance with the invention, it is now proposed that the vertical gradient be reduced by increasing the potential barrier below the emitter zone.

Figure 2:
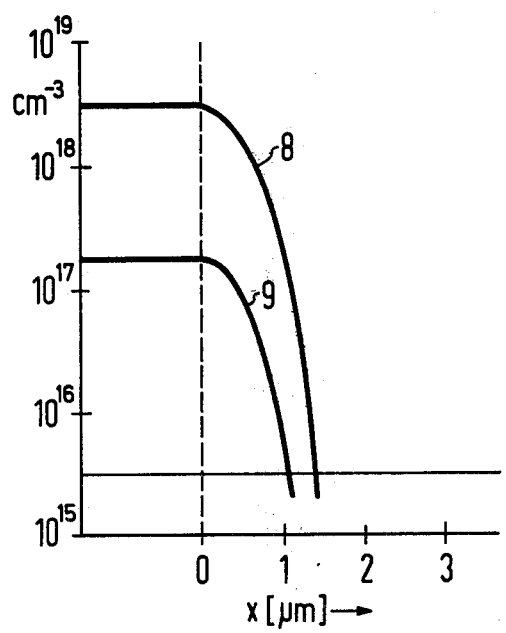
FIG. 2 illustrates doping profiles at the emitter in accordance with the invention in the lateral direction.
Figure 3:
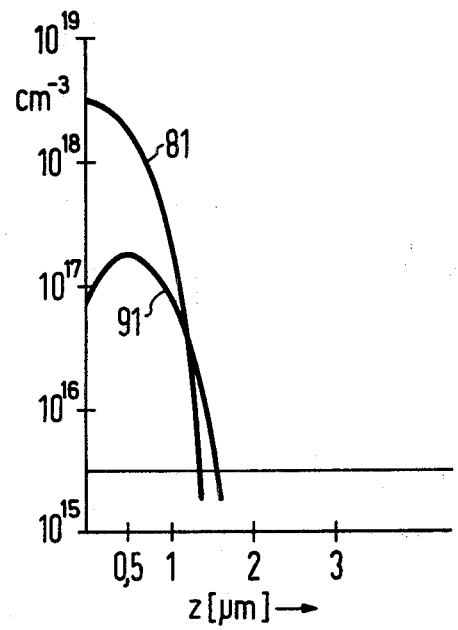
FIG. 3 illustrates doping profiles at the emitter in accordance with the invention in the vertical direction.

FIGS. 2 and 3 illustrate doping concentration curves corresponding to the invention in the lateral and the vertical direction. Here the curves 8 and 81 relate to the p+ doping of the emitter, which is preferably a boron doping, and curves 9 and 91 relate to the implanted n-type donor atoms which are preferably phosphorus atoms. As can be seen from these curves 9 and 91, the doping process of the invention produces a higher potential barrier for the vertical injection than for the lateral injection. As a result, the injection of minority carriers through the higher potential barrier in the vertical direction is impeded. Preferably, in the doping process of the invention, the potential barriers shown in FIGS. 2 and 3 are produced in that donor ions, for example phosphorus ions, are implanted into the emitter zone 5 with the aid of the ion implantation process with sufficiently high energy so that the maximum point of the implantation distribution lies inside the semiconductor at a predetermined distance from the surface. The temperature treatments which follow in the remainder of the production process are selected to be such that the diffusion fronts of the implantation clearly move further away from the surface in the vertical direction than they do in the lateral direction from the edges 54 of the masking oxide. This ensures that in the vertical direction the implantation diffuses beyond the emitter diffusion front which has diffused through the same oxide window, whereas in the lateral direction the implantation does not diffuse beyond the emitter diffusion front which has diffused through the oxide window. Thus the doping process in accordance with the invention results in a higher potential barrier only for the vertical injection. FIG. 2 shows that the doping profile 9 is located within the doping profile 8 which represents the emitter zone 5. FIG. 3 on the other hand indicates that in the vertical direction the doping profile 91 extends beyond the doping profile 81 which represents the emitter zone in the vertical direction, so that a potential barrier is formed in the vertical direction below the emitter zone.

The implantation can be effected, for example, with phosphorus at an acceleration voltage of approx. 400 kV. This leads to a penetration depth of 0.5 $\mu$m before the succeeding temperature treatments.

Figure 4:
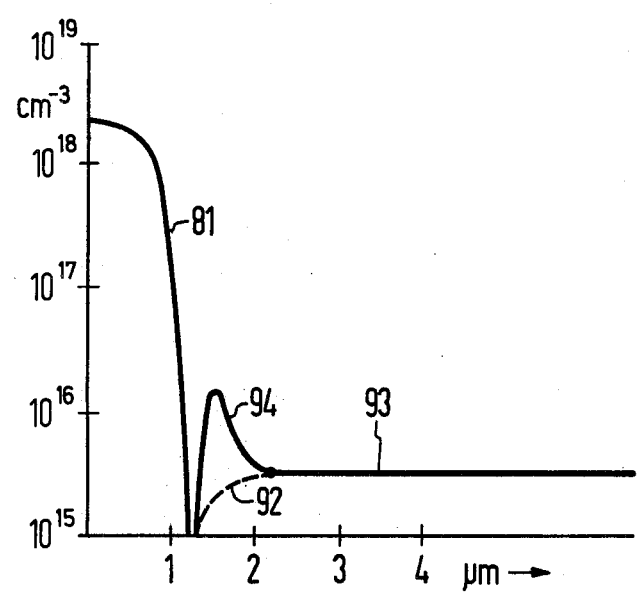
FIG. 4 illustrates a comparison between the doping profile at and between the emitter without implantation, and the doping profile in accordance with the invention with deep implantation in the vertical direction.

As an illustration of the process in accordance with the invention, FIG. 4 shows the entire doping profile in the vertical direction. Commencing from the surface of the emitter zone 5, first the p-type doping concentration represented by the curve 81 prevails i.e. the concentration of the p+ doped zone 5. In conventional transistors, this concentration 81 is followed by the doping concentration, represented by the curve arms 92 and 93, of the n-epitaxial layer 2. The process in accordance with the invention alters the doping profile 92 in such manner that it is replaced by the doping profile 94 which, within the n-epitaxial layer 2, extends in front of the p-doped emitter zone 5, and supplies a potential barrier produced by the high n-concentration.

In the production of a lateral bipolar npn transistor in accordance with the invention, charge carriers of the opposite type to those in the case of the above described pnp transistor are introduced into the corresponding zones of the transistor.

In the following an exemplary embodiment for the production of a lateral pnp transistor will be described.

First, n-type donor ions, preferably phosphorus ions in a dose of approximately $10^{12}$/cm$^{-2}$, are implanted into the opening 54 of the arrangement in FIG. 1 at an acceleration voltage of approx. 400 kV. The remaining zones of the arrangement are covered by a mask. The penetration depth of the phosphorus ions amounts to approx. 0.5 $\mu$m. After the implantation, a temperature treatment is carried out at, for example, 1150° C., for a time duration of approximately 30 minutes for purposes of healing and driving in further the phosphorus implantation. With the aid of this temperature step it is ensured that, together with succeeding temperature steps, the requisite penetration depth for the phosphorus implantation is reached.

Then, the emitter zone 5 and the collector zone 4 are produced in known manner by diffusion. For this purpose, the surfaces of the zone 5 and of the zone 4 are covered with boron using a masking technique. In the subsequent temperature treatment at approximately 1100° C. lasting for approximately 45 minutes, boron diffuses out of the boron coating into the zones 4 and 5, whereby the emitter zone and the collector zone are formed. The production by diffusion of the base terminal zone 6 is correspondingly effected by covering the surface of the zone 6 with phosphorus and a subsequent temperature treatment at approximately 1000° C., for a duration of approximately 60 minutes. When the surface of the zone 6 is covered with phosphorus, the surface of the remaining semiconductor arrangement is protected by a mask. Correspondingly, when the surfaces of the zones 4 and 5 are covered with boron, the remainder of the semiconductor arrangement is protected by a mask.

In the described process, the emitter zone and the collector zone have a thickness of approximately 1.3 $\mu$m. As a result of the temperature treatments carried out in the production of these two zones, the penetration depth for the phosporus implantation is up to approximately 1.5 $\mu$m in the z-direction.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A method for producing a lateral bipolar transistor having a semiconductor substrate of p conductivity type, an epitaxial layer arranged thereon of n conductivity type, lateral base and emitter zones in said epitaxial layer; a buried layer of n conductivity type beneath said base and emitter zones in said epitaxial layer and a high potential barrier beneath the emitter zone to prevent vertical injection current, comprising the steps of:
   (a) ion implanting donor ions down into the emitter zone;
   (b) temperature treating the implanted ions to cause diffusion more vertically than laterally, a front of the diffusion extending beyond the emitter zone in the vertical direction but not as far as the buried layer to create said high potential barrier and not beyond the emitter zone in any lateral direction.

2. The method of claim 1, characterized in that the ion implanting is effected through an oxide window through which a diffusion of the emitter zone also occurs.

3. The method of claim 1 including the steps of implanting phosphorus by said step of ion implanting through an oxide window into the emitter zone in a dose of $10^{12}$/cm$^{-2}$ and with an acceleration voltage of 400 kV, that the temperature treating step comprises a temperature treatment at approximately 1150° C. for a duration of approximately 30 minutes and that in another process step, the emitter zone and the collector zone are produced by a boron diffusion, the remaining surface of the semiconductor arrangement being protected by a mask, that a temperature treatment is then carried out at approximately 1100° C. for approximately 45 minutes, that subsequently the base terminal zone is produced with a phosphorus diffusion, the remainder of the surface of the arrangement being protected by a masking layer, and that subsequently a temperature treatment is carried out at approximately 1000° C. for approximately 60 minutes.

4. A method for producing a lateral bipolar transistor having a semiconductor substrate of n conductivity type, an epitaxial layer arranged thereon of p conductivity type, lateral base and emitter zones in said epitaxial layer, a buried layer of p conductivity type beneath said base and emitter zones in said epitaxial layer and a high potential barrier beneath the emitter zone to prevent vertical injection current, comprising the steps of:
   (a) ion implanting acceptor ions down into the emitter zone;

(b) temperature treating the implanted ions to cause diffusion more vertically than laterally, a front of the diffusion extending beyond the emitter zone in the vertical direction but not as far as the buried layer to create said high potential barrier and not beyond the emitter zone in any lateral direction.

5. The method of claim 4, characterized in that the ion implanting is effected through an oxide window through which a diffusion of the emitter zone also occurs.

6. A method of producing a lateral bipolar transistor in which there is substantially no vertical injection of charge carriers from an emitter of the transistor by employing a buried layer in combination with a high potential barrier below the emitter in a direction of the vertical charge injection, comprising the steps of:
   (a) providing a semiconductor substrate of first conductivity type;
   (b) providing an epitaxial layer of second conductivity type on the substrate;
   (c) providing a buried layer of second conductivity type in at least a portion of the epitaxial layer;
   (d) ion implanting ions of second conductivity type charge down into the epitaxial layer and diffusing lateral collector and emitter zones of first conductivity type into the epitaxial layer above the buried layer, the emitter zone being positioned to entirely surround the implanted ions;
   (e) diffusing the implanted ions by temperature treatment to cause a front of the diffusion to extend beyond the emitter zone but not as far as the buried layer in the vertical direction and not beyond the emitter zone in the lateral direction so as to create said high potential barrier below substantially the entire emitter zone yet without creating a potential barrier to any lateral side of the emitter zone such that there is substantially no vertical injection of charge carriers when the transistor is operating.

7. The method of claim 6 wherein the implanted ions are subject to a first temperature treatment diffusion prior to diffusion of the collector and emitter and to a second temperature diffusion during the collector and emitter diffusion.

* * * * *